US011462121B2

(12) United States Patent
Delisle (10) Patent No.: US 11,462,121 B2
(45) Date of Patent: Oct. 4, 2022

(54) VISUALIZING SUB-SYSTEMS OF A VIRTUAL SIMULATED ELEMENT IN AN INTERACTIVE COMPUTER SIMULATION SYSTEM

(71) Applicant: CAE Inc., Saint-Laurent (CA)

(72) Inventor: Jean-François Delisle, Montréal (CA)

(73) Assignee: CAE Inc., Saint-Laurent (CA)

( * ) Notice: Subject to any disclaimer, the term of this patent is extended or adjusted under 35 U.S.C. 154(b) by 388 days.

(21) Appl. No.: 15/432,988

(22) Filed: Feb. 15, 2017

(65) Prior Publication Data

US 2018/0232132 A1    Aug. 16, 2018

(51) Int. Cl.
*G09B 9/20*        (2006.01)
*G09B 9/30*        (2006.01)
(Continued)

(52) U.S. Cl.
CPC .............. *G09B 9/301* (2013.01); *G06F 3/01* (2013.01); *G06F 3/011* (2013.01); *G06F 3/0481* (2013.01); *G06F 30/20* (2020.01); *G06T 11/60* (2013.01); *G09B 9/10* (2013.01); *G09B 9/12* (2013.01); *G09B 9/20* (2013.01); *G09B 9/24* (2013.01);
(Continued)

(58) Field of Classification Search
CPC ........ G06F 19/00; G06F 19/04; G06F 19/418; G06F 19/18; G06F 15/00; G06F 30/20; G06F 3/011; G06F 3/01; G06F 3/0481; G06F 30/15; G09B 9/301; G09B 9/10;
(Continued)

(56) References Cited

U.S. PATENT DOCUMENTS 4,952,152 A    8/1990    Briggs et al.
5,584,696 A    12/1996   Walker et al.
(Continued)

FOREIGN PATENT DOCUMENTS

CN        1954273 A      4/2007
CN        103136979 A    6/2013

OTHER PUBLICATIONS

Extended European Search Report from corresponding European Patent Application No. 17897009.1 dated Jun. 26, 2020.

*Primary Examiner* — Beau D Spratt
*Assistant Examiner* — K C Chen
(74) *Attorney, Agent, or Firm* — Matthew Roy; Gowling WLG (Canada) LLP (57) ABSTRACT

Method and system for visualizing dynamic virtual sub-systems of a virtual simulated element in an interactive computer simulation system comprising a computer generated environment. One or more tangible instruments control the virtual simulated element in the computer generated environment. A graphical user interface comprising an interactive display portion depicting a rendered view of the virtual simulated element. While an interactive computer simulation of the virtual simulated element is performed in the interactive computer simulation system, a storage system logs dynamic data in relation to the dynamic virtual sub-systems. At least one of the dynamic virtual sub-systems of the virtual simulated element is selected and a subset of dynamic data related to the selected virtual sub-system is loaded from the storage system. The selected virtual sub-system is displayed together with the related dynamic data on the graphical user interface.

22 Claims, 6 Drawing Sheets

(51) Int. Cl.
*G06T 11/60* (2006.01)
*G06F 3/01* (2006.01)
*G06F 30/20* (2020.01)
*G06F 3/0481* (2022.01)
*G09B 9/10* (2006.01)
*G09B 9/12* (2006.01)
*G09B 9/24* (2006.01)
*G06F 30/15* (2020.01)
*G09B 9/08* (2006.01)

(52) U.S. Cl.
CPC .............. *G09B 9/302* (2013.01); *G06F 30/15* (2020.01); *G09B 9/08* (2013.01)

(58) Field of Classification Search
CPC . G09B 9/12; G09B 9/24; G09B 9/302; G09B 9/20; G09B 9/08; G06T 11/60
See application file for complete search history.

(56) References Cited

U.S. PATENT DOCUMENTS

| | | | | |
|---|---|---|---|---|
| 6,944,584 | B1 * | 9/2005 | Tenney | B25J 9/1671 700/17 |
| 8,135,481 | B2 * | 3/2012 | Blevins | G05B 17/02 700/51 |
| 8,751,203 | B2 | 6/2014 | Falash et al. | |
| 8,788,138 | B1 | 7/2014 | Yogesha et al. | |
| 9,449,176 | B1 * | 9/2016 | Adams | G06F 21/577 |
| 2006/0152533 | A1 * | 7/2006 | Read | B25J 9/1671 345/653 |
| 2008/0040084 | A1 * | 2/2008 | Huang | E21B 10/00 703/7 |
| 2008/0155443 | A1 * | 6/2008 | Pannese | G05B 15/02 715/772 |
| 2010/0266992 | A1 * | 10/2010 | Gregoire | G09B 9/00 434/38 |
| 2010/0266994 | A1 * | 10/2010 | Gregoire | G09B 9/00 434/55 |
| 2011/0171612 | A1 | 7/2011 | Gelinske et al. | |
| 2013/0084765 | A1 * | 4/2013 | Pak | A63H 17/00 446/7 |
| 2014/0135986 | A1 * | 5/2014 | Kanehara | B25J 9/1671 700/257 |
| 2014/0310633 | A1 * | 10/2014 | McLellan | G06F 3/04842 715/771 |
| 2015/0050623 | A1 | 2/2015 | Falash et al. | |
| 2015/0079545 | A1 | 3/2015 | Kurtz | |
| 2015/0217874 | A1 * | 8/2015 | Mesguen | B64D 43/00 701/29.1 |
| 2015/0227647 | A1 * | 8/2015 | Shelton | G06F 30/20 703/13 |
| 2015/0261379 | A1 * | 9/2015 | Kneuper | G08G 5/0052 345/173 |
| 2016/0285907 | A1 * | 9/2016 | Nguyen et al. | H04L 29/06 |
| 2016/0357892 | A1 * | 12/2016 | Schechter | G06F 30/20 |
| 2017/0092223 | A1 * | 3/2017 | Fain | G06T 7/70 |
| 2017/0273745 | A1 * | 9/2017 | Turquier | A61B 34/10 |
| 2018/0060456 | A1 * | 3/2018 | Phatak | G06F 30/20 |
| 2020/0189635 | A1 * | 6/2020 | Hurst | G09B 19/167 |

* cited by examiner

VISUALIZING SUB-SYSTEMS OF A VIRTUAL SIMULATED ELEMENT IN AN INTERACTIVE COMPUTER SIMULATION SYSTEM

TECHNICAL FIELD

The present invention relates to an interactive computer simulation system and, more particularly, to simulated system analysis from the interactive computer simulation system.

BACKGROUND

Interactive computer simulation systems are used to train personnel on complex and/or risky tasks. The interactive computer simulation allows a user to interact with a computer generated environment by controlling a simulated element (e.g., an aircraft, a ground vehicle, a space station, etc.). Simulated elements comprise various dynamic sub-systems that act, e.g., in relation to the actions of the user in the interactive computer simulation. It is currently difficult to appreciate the effect of the user actions on specific dynamic sub-systems and equally difficult to appreciate the reaction of a user considering fluctuations in dynamic sub-systems.

The present invention addresses this shortcoming.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with a first aspect, a method is provided for visualizing dynamic virtual sub-systems of a virtual simulated element in an interactive computer simulation system comprising a computer generated environment. One or more tangible instruments are provided in the interactive computer simulation system for controlling the virtual simulated element in the computer generated environment. The method comprises displaying a graphical user interface comprising an interactive display portion depicting a rendered view of the virtual simulated element and, while an interactive computer simulation of the virtual simulated element is performed in the interactive computer simulation system, logging dynamic data in relation to the dynamic virtual sub-systems in a storage system of the interactive computer simulation system. The method also comprises selecting at least one of the dynamic virtual sub-systems of the virtual simulated element, loading a subset of dynamic data related to the selected virtual sub-system from the storage system and displaying the selected virtual sub-system together with the related dynamic data on the graphical user interface.

In some embodiments, selection of the virtual sub-system may be performed after the interactive computer simulation is completed or may alternatively or additionally be performed while the interactive computer simulation is ongoing. In some other embodiments, selection of the virtual sub-system is performed only while the interactive computer simulation is ongoing. In some embodiments, selection of the virtual sub-system is performed only after the interactive computer simulation is completed. Optionally, the subset of dynamic data may be related to a period of time covering simulated events from the interactive computer simulation related to the selected virtual sub-system. The method may further comprise receiving the period of time from the graphical user interface.

In some embodiments, when the interactive computer simulation is still being performed upon selection of the virtual sub-system, loading the subset of dynamic data related to the selected virtual sub-system may also be performed while logging dynamic data in relation to the selected virtual sub-system. The method may then further comprise triggering a malfunction event in relation to the selected virtual sub-system and, optionally, loading a simulation plan for the interactive computer simulation from the storage system. The malfunction event may be triggered from the simulation plan for the interactive computer simulation. The method may also further comprise receiving the malfunction event in a malfunction selection from the graphical user interface before triggering the malfunction event.

The method may further optionally comprise receiving a view-type selection from the graphical user interface before displaying the selected virtual sub-system together with the related dynamic data. The view-type selection being used for selecting between at least two view-types between realistic view-type in which the virtual simulated element and the selected virtual sub-system are depicted using realistic rendering, a logical view-type in which the virtual simulated element and the selected virtual sub-system are depicted using logical rendering, a hybrid view-type in which one of the virtual simulated element or the selected virtual sub-system is depicted using logical rendering while the other one is depicted using realistic rendering and a multi-hybrid view-type in which at least one of the virtual simulated element and the selected virtual sub-system is depicted using logical rendering and realistic rendering.

Optionally, the method may also further comprise receiving a perspective selection for displaying the selected virtual sub-system together with the related dynamic data. The perspective selection being used for selecting between at least two perspectives between one of a set of preset perspectives triggered when a trigger event occurs in the interactive computer simulation, one of the set of preset perspectives selected from the graphical user interface and a floating perspective in which at least one of a relative distance from the virtual simulated element and a relative position to the virtual simulated element is dynamically adjusted through the graphical user interface.

Selecting the virtual sub-system may in some embodiments further comprise, from the graphical user interface, receiving a virtual sub-system selection of the at least one of the dynamic virtual sub-systems. The virtual sub-system selection may be received between a menu selection from a menu portion of the graphical user interface and an interactive selection from the interactive display portion of the graphical user interface that displays the virtual simulated element.

The method may optionally further comprise loading a simulation plan for the interactive computer simulation from the storage system and selecting the virtual sub-system may then be is triggered by detecting a trigger event in the interactive computer simulation. The trigger event may be received from a simulation plan (e.g., scenario-based or lesson plan) and/or from another virtual simulated element in the interactive computer simulation (e.g., interaction/collision with another virtual simulated system)

In some embodiments, the interactive computer simulation comprises a second virtual simulated element comprising a second set of dynamic virtual sub-systems and the method further comprises, while the interactive computer simulation is performed in the interactive computer simulation system, logging dynamic data in relation to the second set of dynamic virtual sub-systems in the storage system of the interactive computer simulation system. The method may then optionally further comprise receiving a simulated element-selection for selecting one or more of the virtual simulated element and the second virtual simulated element for display. The method may also alternatively or in addition further comprise processing corresponding dynamic data from the virtual simulated element and the second dynamic virtual simulated element for detecting trends therein.

In some embodiments, the method further comprises, while a second interactive computer simulation of the virtual simulated element is performed in the interactive computer simulation system, logging a second set of dynamic data in relation to the dynamic virtual sub-systems in the storage system of the interactive computer simulation system and processing corresponding dynamic data from the interactive computer simulation and the second interactive computer simulation for detecting trends therein.

In accordance with a second aspect, an interactive computer simulation system comprising a computer generated environment comprising a virtual simulated element is provided. The interactive computer simulation system comprises one or more tangible instruments, a graphical user interface, a storage system and a processor module.

The one or more tangible instruments is for controlling a virtual simulated element in the computer generated environment, the virtual simulated element comprising a plurality of dynamic virtual sub-systems. The graphical user interface displays an interactive display portion depicting a rendered view of the virtual simulated element. The storage system is for logging, while an interactive computer simulation is performed in the interactive computer simulation system, dynamic data in relation to the dynamic virtual sub-systems. The processor module selects at least one of the dynamic virtual sub-systems of the virtual simulated element and loads a subset of dynamic data related to the selected virtual sub-system from the storage system. The graphical user interface displays the selected virtual sub-system together with the related dynamic data thereon.

Optionally, when the interactive computer simulation is completed or ongoing upon selection of the virtual sub-system, the subset of dynamic data is related to a period of time covering simulated events from the interactive computer simulation related to the selected virtual sub-system. The processor module may also load the subset of dynamic data related to the selected virtual sub-system while the storage system logs dynamic data in relation to the selected virtual sub-system. The processor module may optionally trigger a malfunction event in the interaction computer simulation in relation to the selected virtual sub-system.

The processor module may optionally further load a simulation plan for the interactive computer simulation from the storage system and, in some embodiments, the malfunction event may then be triggered from the simulation plan. The graphical user interface may also alternatively or additionally further receive a malfunction selection and, in some embodiments, the malfunction event may then be triggered by the processor module in response thereto.

In some embodiments, the interactive computer simulation comprises a second virtual simulated element comprising a second set of dynamic virtual sub-systems and the storage system further, while the interactive computer simulation is performed in the interactive computer simulation system, logs dynamic data in relation to the second set of dynamic virtual sub-systems. Optionally, when a simulated element-system selection is received from the graphical user interface, at least one of the virtual simulated element and the second virtual simulated element is selected thereby for display. The processor module may also alternatively or additionally further process corresponding dynamic data from the virtual simulated element and the second virtual simulated element for detecting trends therein.

The storage system may optionally, while a second interactive computer simulation of the virtual simulated element is performed, log a second set of dynamic data in relation to the dynamic virtual sub-systems and the processor module may then further process corresponding dynamic data from the interactive computer simulation and the second interactive computer simulation for detecting trends therein.

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
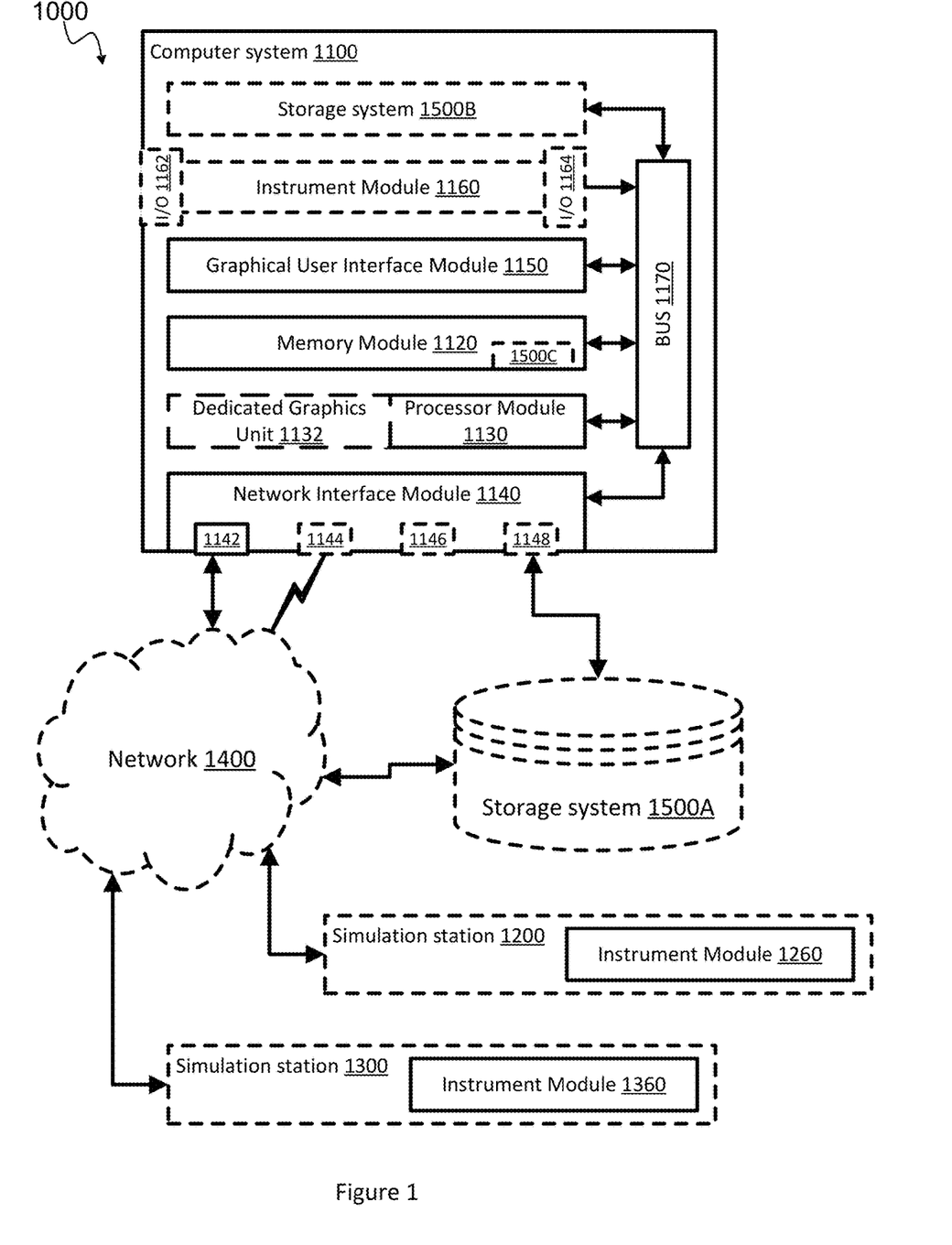
FIG. 1 is a logical modular view of an exemplary interactive computer simulation system in accordance with an embodiment of the present invention.

Reference is now made to the drawings in which FIG. 1 shows a logical modular view of an exemplary interactive computer simulation system 1000 in accordance with the teachings of the present invention. The interactive computer simulation system 1000 performs one or more interactive computer simulations. Each interactive computer simulation comprises one or more virtual simulated elements each representing an actual system (e.g., multiple virtual aircraft systems each representing an actual aircraft). Each interactive computer simulation provides a virtual environment and various tangible instruments (or controls) to allow enactment of different scenarios for the purpose of training one or more users (or trainees), using one or more of the virtual simulated elements, in the operation and/or understanding of the corresponding one or more actual systems. The virtual simulated element, or simulated element, is defined herein as a simulated system comprising multiple simulated dynamic sub-systems, or dynamic sub-systems. The simulated element is a virtual version that simulates, to the extent required by the interactive computer simulation, behavior of an actual system. Correspondingly, each of the simulated dynamic sub-systems of the simulated element is a virtual version, to the extent required but the interactive computer simulation, behavior of actual sub-systems of the actual system.

In the depicted embodiment of FIG. 1, the interactive computer simulation system 1000 comprises a computer system 1100 for visualizing dynamic sub-systems from at least one of the virtual simulated elements from the computer simulation executed on the interactive computer simulation system 1000. The interactive computer simulation system 1000 typically comprises one or more simulation stations 1200 and 1300 that each allow one or more users to interact to control a virtual simulated element in one of the interactive computer simulation(s) of the interactive computer simulation system 1000. The computer system 1100 and the simulation stations 1200 and 1300 may be connected via a network 1400, via direct connections or a mix of direct and network connections. In the depicted example of FIG. 1, the computer system 1100 is distinct from the simulation stations 1200, 1300 while, in some embodiments, the computer system 1000 may be integrated with one or more of the simulation stations 1200, 1300. Various network links may be implicitly or explicitly used in the context of the present invention. While a link may be depicted as a wireless link, it could also be embodied as a wired link using a coaxial cable, an optical fiber, a category 5 cable, and the like. A wired or wireless access point (not shown) may be present on links. Likewise, any number of routers and/or switches (not shown) may be present on links, which may further transit through the Internet.

In the depicted example of FIG. 1, the computer system 1100 comprises a memory module 1120, a processor module 1130 and a network interface module 1140. The processor module 1130 may represent a single processor with one or more processor cores or an array of processors, each comprising one or more processor cores. In some embodiments, the processor module 1130 may also comprise a dedicated graphics processing unit 1132. The dedicated graphics processing unit 1132 may be required, for instance, when the interactive computer simulation system 1000 performs an immersive simulation (e.g., pilot training-certified flight simulator), which requires extensive image generation capabilities (i.e., quality and throughput) to maintain expected realism of such immersive simulation. In some embodiments, each of the simulation stations 1200, 1300 comprise a processor module having a dedicated graphics processing unit similar to the dedicated graphics processing unit 1132. The memory module 1120 may comprise various types of memory (different standardized or kinds of Random Access Memory (RAM) modules, memory cards, Read-Only Memory (ROM) modules, programmable ROM, etc.). The network interface module 1140 represents at least one physical interface that can be used to communicate with other network nodes. The network interface module 1140 may be made visible to the other modules of the computer system 1100 through one or more logical interfaces. The actual stacks of protocols used by the physical network interface(s) and/or logical network interface(s) 1142, 1144, 1146, 1148 of the network interface module 1140 do not affect the teachings of the present invention. The variants of processor module 1130, memory module 1120 and network interface module 1140 usable in the context of the present invention will be readily apparent to persons skilled in the art.

A bus 1170 is depicted as an example of means for exchanging data between the different modules of the computer system 1100. The present invention is not affected by the way the different modules exchange information between them. For instance, the memory module 1120 and the processor module 1130 could be connected by a parallel bus, but could also be connected by a serial connection or involve an intermediate module (not shown) without affecting the teachings of the present invention.

Likewise, even though explicit mentions of the memory module 1120 and/or the processor module 1130 are not made throughout the description of the various embodiments, persons skilled in the art will readily recognize that such modules are used in conjunction with other modules of the computer system 1100 to perform routine as well as innovative steps related to the present invention.

The interactive computer simulation system 1000 comprises a storage system 1500 for logging dynamic data in relation to the dynamic sub-systems while the interactive computer simulation is performed. FIG. 1 shows examples of the storage system 1500 as a distinct database system 1500A, a distinct module 1500B of the computer system 1110 or a sub-module 1500C of the memory module 1120 of the computer system 1110. The storage system 1500 may also comprise storage modules (not shown) on the simulation stations 1200, 1300. The storage system 1500 may be distributed over different systems A, B, C and/or the simulations stations 1200, 1300 or may be in a single system. The storage system 1500 may comprise one or more logical or physical as well as local or remote hard disk drive (HDD) (or an array thereof). The storage system 1500 may further comprise a local or remote database made accessible to the computer system 1100 by a standardized or proprietary interface or via the network interface module 1140. The variants of storage system 1500 usable in the context of the present invention will be readily apparent to persons skilled in the art.

The computer system 1100 comprises a graphical user interface (GUI) module 1150 that ultimately allows the visualization of virtual dynamic sub-systems from the virtual simulated element. The GUI module 1150 may comprise one or more display screens such as a wired or wireless flat screen, a wired or wireless touch-sensitive display, a tablet computer, a portable computer or a smart phone.

An Instructor Operating Station (IOS) may be provided for allowing various management tasks (not shown) to be performed in the interactive computer simulation system 1000. The tasks associated with the IOS allow for control and/or monitoring of one or more ongoing interactive computer simulations. For instance, the IOS may be used for allowing an instructor to participate to the interactive computer simulation and possibly additional interactive computer simulation(s). In some embodiments, the IOS is provided by the computer system 1100. In other embodiments, the IOS may be co-located with the computer system 1100 (e.g., within the same room or simulation enclosure) or remote therefrom (e.g., in different rooms or in different locations). Skilled persons will understand the many instances of the IOS may be concurrently provided in the interactive computer simulation system 1000. The IOS may provide a computer simulation management interface, which may be displayed on a dedicated IOS display module (not shown) or the GUI module 1150. The IOS could be located in close proximity with the computer system 1100, but may also be provided outside of the computer system 1100, in communication therewith.

When multiple simulation stations 1200 and 1300 are present in the system 1000, the IOS may present different views of the computer program management interface (e.g., to manage different aspects therewith) or they may all present the same view thereof. The computer program management interface may be permanently shown on a first of the screens of the IOS display module while a second of the screen of the IOS display module shows a view of the interactive computer simulation (i.e., adapted view considering characteristics of the second screen). The computer program management interface may also be triggered on the IOS, e.g., by a touch gesture and/or an event in the interactive computer program (e.g., milestone reached, unexpected action from the user, or action outside of expected parameters, success or failure of a certain mission, etc.). The computer program management interface may provide access to settings of the interactive computer simulation and/or of the simulation stations 1200 and/or 1300. A virtualized IOS may also be provided to the user (e.g., through the GUI module 1150) on a main screen, on a secondary screen or a dedicated screen. In some embodiments, a Brief and Debrief System (BDS) may also be provided. The BDS may be seen as a version of the IOS used during playback of recorded data only.

For instance, when IOS and/or BDS functionalities are provided through the computer system 1100, the GUI module 1150 may further be used to monitor and control one or more ongoing or recorded interactive computer simulation (e.g., triggering/monitoring events and/or selecting a perspective from which to view the ongoing or recorded chain of events of one or more interactive computer simulation).

Users of the interactive computer simulation system 1000 (e.g., users of the simulation stations 1200 and/or 1300, and/or computer system 1100) interact in the interactive computer simulation to control a virtual simulated element in a computer generated environment of the interactive computer simulation system 1000 (e.g., instructors or experts, trainees such as a pilot and co-pilot, a driver, an operator, a surgeon, a flight investigator, a training analyst, a flight analyst, etc.). Examples of virtual simulated elements include a simulated aircraft system, a simulated ground vehicle system, a simulated spacecraft or space station system, a simulated control room system, unmanned vehicle or drone, simulated human mannequin, etc. Examples of virtual dynamic sub-systems vary depending on the virtual simulated element. In the example of a simulated aircraft system, typical virtual dynamic sub-systems may include virtual hydraulic systems, virtual communication systems, virtual display systems, virtual wiring systems, virtual in-flight entertainment systems, virtual fuel systems, virtual lighting systems, virtual rudder system, virtual flap system, virtual landing gear system, etc. In the example of a simulated living system, typical virtual dynamic sub-systems may include blood system, digestive system immunity response system, lymphatic system, nervous system, biometric data such as temperature, blood pressure and other related physical data, etc. When a trainee or user is involved, actual measurements of biometric data may also be recorded (e.g., for subsequent correlation with other recorded data). For instance, biometric data from a pilot interacting in a computer simulation with one or more tangible instruments at the simulation station 1200 may be recorded (such as temperature, blood pressure and other related physical data). As a skilled person would appreciate, most virtual sub-systems are directly or indirectly affected by interactions of the user with one or more tangible instruments that allow the user to interact (e.g., provide different commands in order to control the virtual simulated element) during the interactive computer system in the computer generated environment. Some other virtual sub-systems may be affected by time elapsed during the interactive computer system and may further take into account the interactions of the user with one or more tangible instruments. For instance, in the example of a simulated aircraft system, a virtual aircraft structure subsystem may comprise one or more virtual mechanical components. Failure of any one of virtual mechanical components, or the virtual aircraft structure subsystem altogether, may be based on accumulated mechanical stress considering use time (e.g., number of flights and operating hours) and also based on maneuvers caused by the pilot manipulating the one or more tangible instruments.

Figure 2:
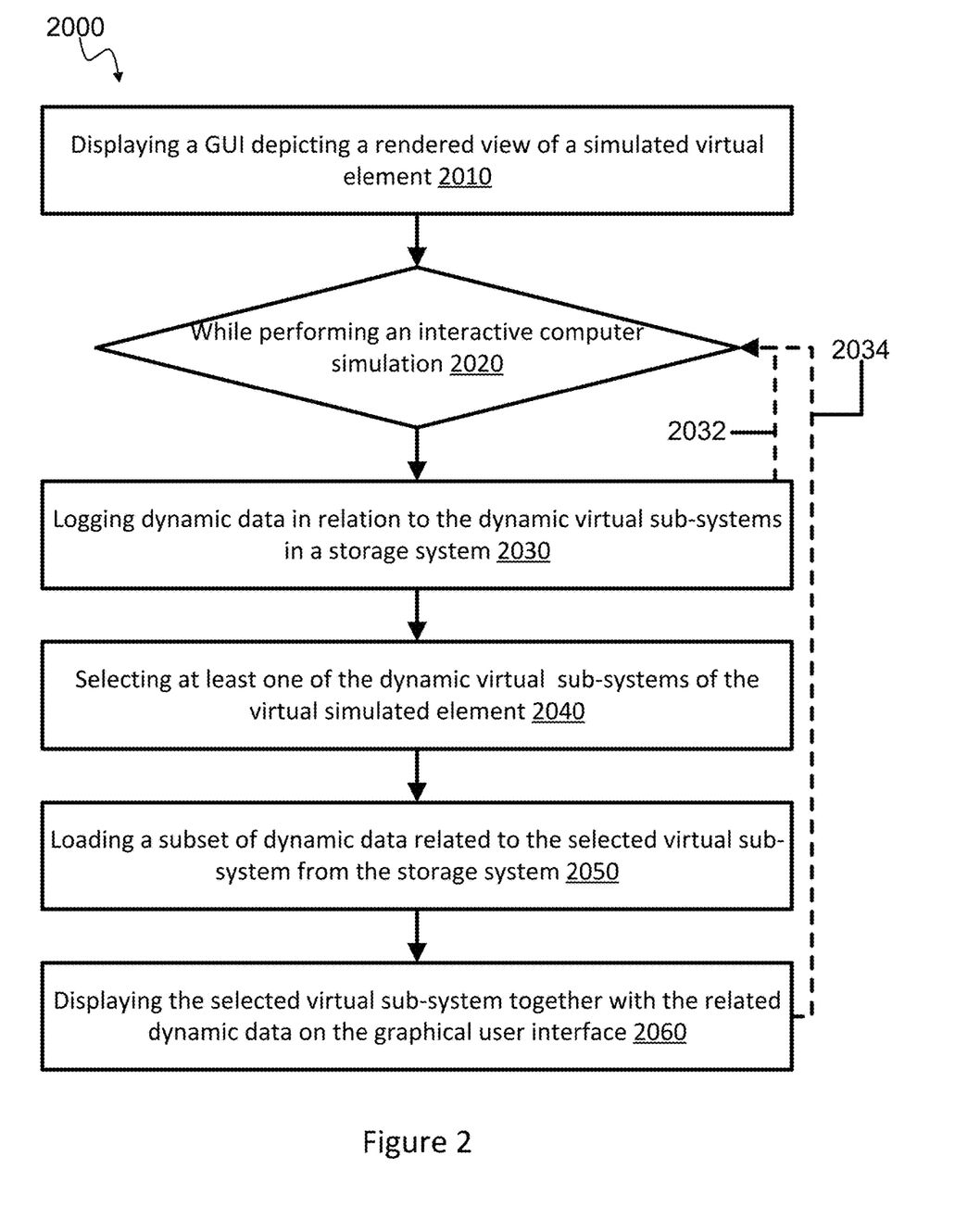
FIG. 2 is a flow chart of an exemplary method in accordance with an embodiment of the present invention.

Reference is now concurrently made to FIG. 1 and FIG. 2, which shows a flow chart of an exemplary method 2000 in accordance with the teachings of the present invention. The method 2000 allows visualizing virtual dynamic sub-systems of a virtual simulated element in the interactive computer simulation system 1000. One or more tangible instrument modules 1160, 1260, 1360 are provided in the interactive computer simulation system 1000 for controlling the virtual simulated element. The tangible instrument provided by the instrument modules 1160, 1260 and/or 1360 are tightly related to the element being simulated. In the example of the simulated aircraft system, typical instruments include various switches, levers, pedals and the like accessible to the user for controlling the aircraft in the interactive computer simulation. Depending on the type of simulation (e.g., level of immersivity), the tangible instruments may be more or less realistic compared to those that would be available in an actual aircraft. For instance, the tangible instrument provided by the modules 1160, 1260 and/or 1360 may replicate an actual aircraft cockpit where actual instruments found in the actual aircraft or physical interfaces having similar physical characteristics are provided to the user (or trainee). As previously describer, the actions that the user or trainee takes with one or more of the tangible instruments provided via the instrument module(s) 1160, 1260 and/or 1360 (modifying lever positions, activating/deactivating switches, etc.) allow the user or trainee to control the virtual simulated element in the interactive computer simulation. In the context of an immersive simulation being performed in the interactive computer simulation system 1000, the instrument module 1160, 1260 and/or 1360 would typically support a replicate of an actual instrument panel found in the actual system being the subject of the immersive simulation. In such an immersive simulation, the dedicated graphics processing unit 1132 would also typically be required. While the present invention is applicable to immersive simulations (e.g., flight simulators certified for commercial pilot training and/or military pilot training), skilled persons will readily recognize and be able to apply its teachings to other types of interactive computer simulations.

In some embodiment, an optional external input/output (I/O) module 1162 and/or an optional internal input/output (I/O) module 1164 may be provided with the instrument module 1160. Skilled people will understand that any of the instrument modules 1160, 1260 and/or 1360 may be provided with one or both of the I/O modules such as the ones depicted for the computer system 1000. The external input/output (I/O) module 1162 of the instrument module 1160, 1260 and/or 1360 may connect one or more external tangible instruments (not shown) therethrough. The external I/O module 1162 may be required, for instance, for interfacing the interactive computer simulation system 1000 with one or more tangible instrument identical to an Original Equipment Manufacturer (OEM) part that cannot be integrated into the computer system 1100 and/or the simulation station(s) 1200, 1300 (e.g., a tangible instrument exactly as the one that would be found in the actual system subject of the interactive simulation). The internal input/output (I/O) module 1162 of the instrument module 1160, 1260 and/or 1360 may connect one or more tangible instruments integrated with the instrument module 1160, 1260 and/or 1360. The I/O 1162 may comprise necessary interface(s) to exchange data, set data or get data from such integrated tangible instruments. The internal I/O module 1162 may be required, for instance, for interfacing the interactive computer simulation system 1100 with one or more integrated tangible instrument identical to an Original Equipment Manufacturer (OEM) part (e.g., a tangible instrument exactly as the one that would be found in the actual system subject of the interactive simulation). The I/O 1162 may comprise necessary interface(s) to exchange data, set data or get data from such integrated tangible instruments.

The graphical user interface module 1150 displays 2010 an interactive display portion depicting a rendered view of the virtual simulated element. While an interactive computer simulation of the virtual simulated element is performed 2020 in the interactive computer simulation system 1000, the storage system 1500 logs 2030 dynamic data in relation to the virtual dynamic sub-systems. The processing module 1130 then selects 2040 at least one of the virtual dynamic sub-systems of the virtual simulated element. A subset of virtual dynamic data related to the selected sub-system is then loaded 2050 from the storage system 1500. The selected virtual sub-system is then displayed 2060 together with the related dynamic data via the graphical user interface module 1150.

In some embodiments, only the logging 2030 of the dynamic data is performed during the interactive computer simulation (2032) and the displaying 2060 is performed when the interactive computer simulation is completed (e.g., the user or trainee has finished the tasks or objectives assigned in a given scenario, simulation plan and/or training plan and is ready to quit the interactive computer simulation). In some embodiments, the displaying 2060 may also be performed (2034) while the interactive computer simulation is ongoing (e.g. at runtime of the interactive computer simulation in real-time processing or real-time priority processing). The displaying 2060 being performed when the interactive computer simulation is still being performed requires that the selecting 2040 of the virtual dynamic sub-systems and loading 2050 of the subset of dynamic data related to the selected virtual sub-system be performed while logging 2030 dynamic data in relation to the selected virtual sub-system. Only one mode 2032 or 2034 may be supported while both modes may be supported in other embodiments. That is, in some embodiments, the displaying 2060 may be performed while a given interactive computer simulation is ongoing and, at a later time, the displaying 2060 may be performed again (i.e., from the same data logged in 2030) while the given interactive computer simulation is completed.

Upon selection of the virtual sub-system (2040), the subset of virtual dynamic data may be related to a period of time covering simulated events from the interactive computer simulation related to the selected virtual sub-system. The period of time may be set differently when the interactive computer simulation is ongoing or completed. Alternatively or additionally, the period of time may be dynamic, e.g., for last 5 seconds, 5 minutes or 5 hours. The period of time may also be fixed from the time of the selection 2040 (5 seconds, 5 minutes or 5 hours before selection 2040 or centered on the time of the selection 2040). The period of time may yet also be fixed based on the last relevant moment for the simulated element as a whole or for the virtual sub-system selected in 2040. For instance, the period of time may correspond to the last period of time during which the virtual sub-system was last active or received a command resulting from action of the user or trainee on the tangible instruments or has triggered events (e.g., specific or any event). Alternatively or additionally, the period of time may or may not be linear. For instance, the period of time during "permanent regime" moments (e.g., stable altitude and speed during a simulated flight) of the interactive computer simulation may use a different scale compared to "transition regime" moments (e.g., lift-off, ascension, landing, and descent during a simulated flight). Alternatively or additionally, the period of time may or may not be completely consecutive (e.g., the period may cover the first 5 minutes and last 5 minutes of a completed interactive computer simulation). For instance, for a virtual landing gear sub-system, the period of time may correspond to time during which the simulated landing gear has been moving during a simulated flight. For a virtual fuel sub-system, the period of time may be set from the moment of initial fueling or initial turbine ignition to the moment of refuel or turbine shutdown. Alternatively or in addition, the period of time may be set by default for all virtual sub-systems or may be set based on the selected virtual sub-system. The period of time may also alternatively or additionally (e.g. override of default or dynamic value) be received from the graphical user interface module 1150.

In some embodiments, a simulation plan may further be loaded (not shown) from the storage system 1500 in relation the interaction computer simulation that involves the virtual simulated element. The simulation plan may be loaded in instances where the displaying 2060 happens while the interactive computer simulation is ongoing or completed. The simulation plan may comprise a training plan, a lesson plan or a scenario-based plan (e.g., with specific or dynamic objectives to be reached). The simulation plan may also be used alternatively or additionally to set the period of time covering simulated events from the interactive computer simulation related to the selected virtual sub-system.

A malfunction event in relation to the selected virtual subsystem may be triggered by the processing module 1130 during the interactive computer simulation (e.g. in real-time processing or real-time processing priority). The malfunction event may be triggered from the simulation plan and/or the graphical user interface module 1150 may further receive a malfunction selection that triggers the malfunction event. For instance, an instructor may decide, though graphical user interface module 1150, to initiate a malfunction event during the interactive computer simulation performed in the interactive computer simulation system 1000. The trigger of the malfunction event may be done for the purpose of measuring the reaction of one or more trainees (e.g., present in the simulation station 1200, 1300 and/or the computer system 1000). In some embodiments, two trainees and an instructor are present in the computer system 1100 while the interactive computer system is performed in the interactive computer simulation system 1000. The initiated malfunction event from the instructor may be required to evaluate the competences of one or both of the trainees in the computer system 1100 when faced with specific circumstances. The instructor may also evaluate the competences of one or both of the trainees in the computer system 1100 when faced with specific circumstances triggered by the scenario-based plan at a specific moment (e.g., not related to actions of the trainee(s) in the interactive computer simulation) or as a feedback of actions from the trainees in the interactive computer simulation), which may or may not be related to a malfunction event. Likewise, the instructor may also evaluate the competences of one or both of the trainees in the computer system 1100 when faced with specific circumstances that are not related to a malfunction (e.g., regular procedure or expected events). The computer system 1100 and the method 2000 may then be specifically used for debriefing one or more of the reactions of the trainees of the computer system 1100 during the interactive computer simulation (2034) or after the interactive computer simulation (2032).

Reference is now concurrently made to FIG. 1 to FIG. 6. Each of the FIGS. 1 to 6 shows a logical view of an exemplary Graphical User Interface (GUI) depiction 3000, 4000, 5000, 6000 in accordance with embodiments of the present invention. The depictions 3000, 4000, 5000 and 6000 present images that would typically be provided by the graphical user interface module 1150 in a portion of the GUI, allowing the graphical user interface module 1150 to provide additional menus and interactive selection options (not shown) to the user, trainee or instructor of the computer system 1100 with the depiction(s) 3000, 400, 5000, 6000. Skilled person will also recognize that the depiction(s) 3000, 400, 5000, 6000 may also be provided, in addition or alternatively, in a selectable full screen mode.

The depiction(s) 3000, 400, 5000, 6000 may be related to a view-type selection provided, in some embodiments, by the graphical user interface module 1150. Examples of view-type modes include a realistic view-type mode in which the virtual simulated element and the selected virtual sub-system are depicted using realistic rendering and a logical view-type mode in which the virtual simulated element and the selected virtual sub-system are depicted using logical rendering. In some embodiments, a hybrid view-type mode may also be provided in which one of the virtual simulated element or the selected virtual sub-system is depicted using logical rendering while the other one is depicted using realistic rendering. A multi-hybrid view-type mode may also be provided in which at least one of the virtual simulated element and the selected virtual sub-system is depicted using logical rendering and realistic rendering.

For instance, when the virtual sub-system involved articulated parts (e.g., aircraft flaps), it may be shown in realistic rendering while related data (e.g., flap angle) may alternatively or additionally be shown in logical rendering. For virtual sub-systems involving fluids, a Doppler fluid display may be provided where movements are depicted in different colors or shadings. Color or shading indicator(s) may also be used to efficiently display the relative proximity of current value(s) associated with the virtual sub-system compared to expected value(s) (e.g., a flap from the flap sub-system shown in darker shades of red as the distance from an expected position increases while others are shown in green or without color when the expected position is matched). The graphical user interface 1150 may also allow toggling between the different view-type modes.

Figure 3:
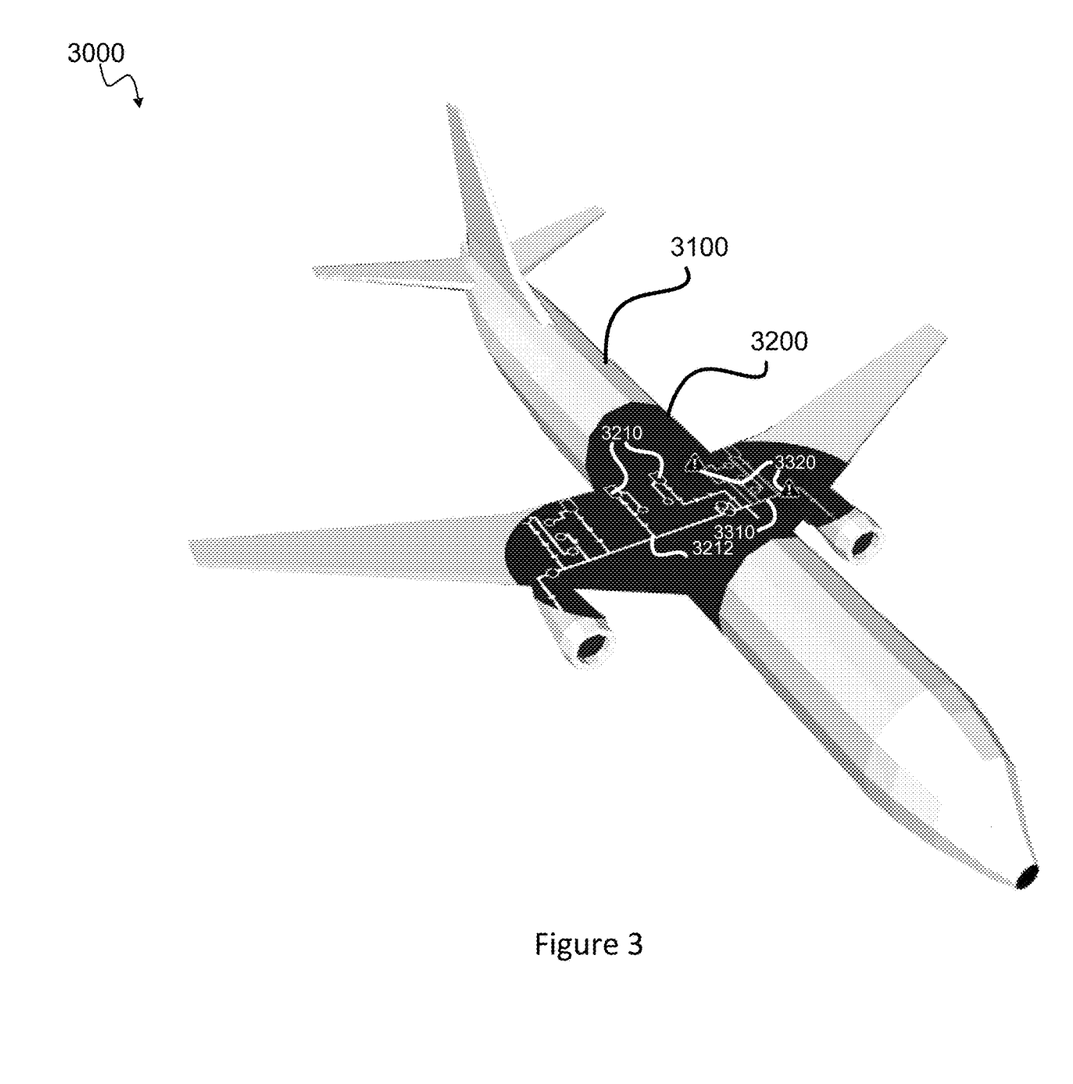
FIG. 3 is a logical view of a first exemplary Graphical User Interface (GUI) depiction in accordance with an embodiment of the present invention.

On FIGS. 3 to 6, different options are depicted for the purpose of illustrating some embodiments of the optional view-type selection provided by the graphical user interface module 1150. FIG. 3 shows a depiction 3000 comprising a realistic rendering of an aircraft as the exemplary virtual simulated element 3100. The aircraft 3100 would be displayed in 2010. The depiction 3000 also shows a logical rendering of a fuel distribution system as the exemplary virtual dynamic sub-system 3200. The logical rendering of the fuel distribution system 3200 would be displayed upon selection 2040 (e.g., clicked on the aircraft 3100 or selected in a menu (not shown) or the like). The logical rendering of the fuel distribution system 3200 comprises logical views of fuel pumps 3210 and fuel distribution pipes 3212. Dynamic data previously logged (2030) during the interactive computer simulation (2020) concerning the fuel distribution system 3200, a section 3310 of the logical fuel distribution pipes 3212 is loaded (2050) and the graphical user interface module 1150 highlights (e.g., with a different texture, different color, etc.) and displays warning icons 3320 in relation to the loaded dynamic data for the highlighted section 3310 of the logical fuel distribution pipes 3212. The highlighted section 3310 and warning icons 3320 represent one way of displaying (2060) the dynamic data related to the logical rendering of the fuel distribution system 3200. In some embodiments, numerical values and/or additional visual representations (not shown) may alternatively or additionally be provided to represent the dynamic data (e.g., numerical value (s) added as a floating text box when a cursor is brought over the virtual dynamic sub-system 3200, the highlighted section 3310 and/or the warning icon(s) 3320).

Figure 4:
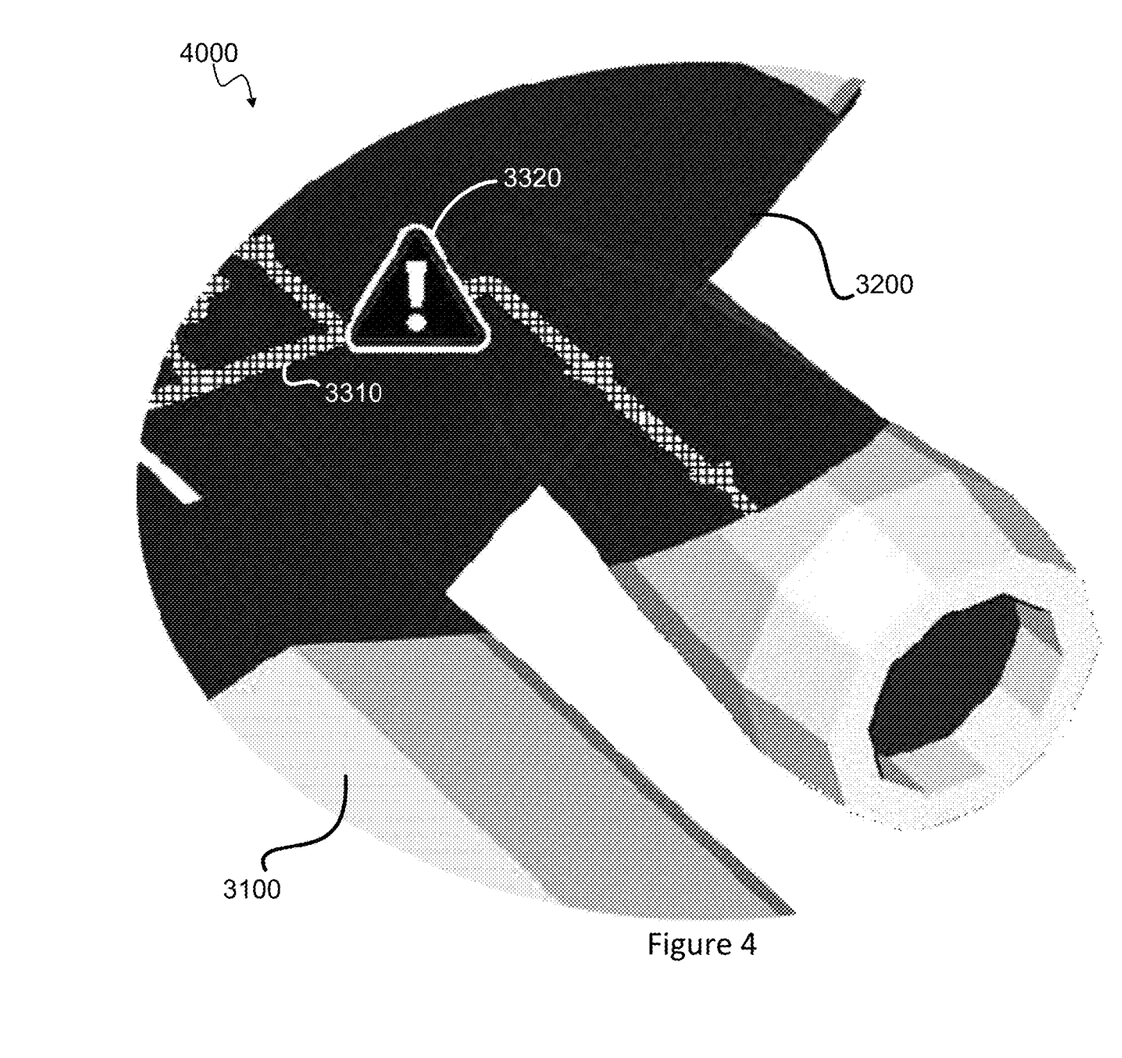
FIG. 4 is a logical view of a second exemplary GUI depiction in accordance with an embodiment of the present invention.
Figure 5:
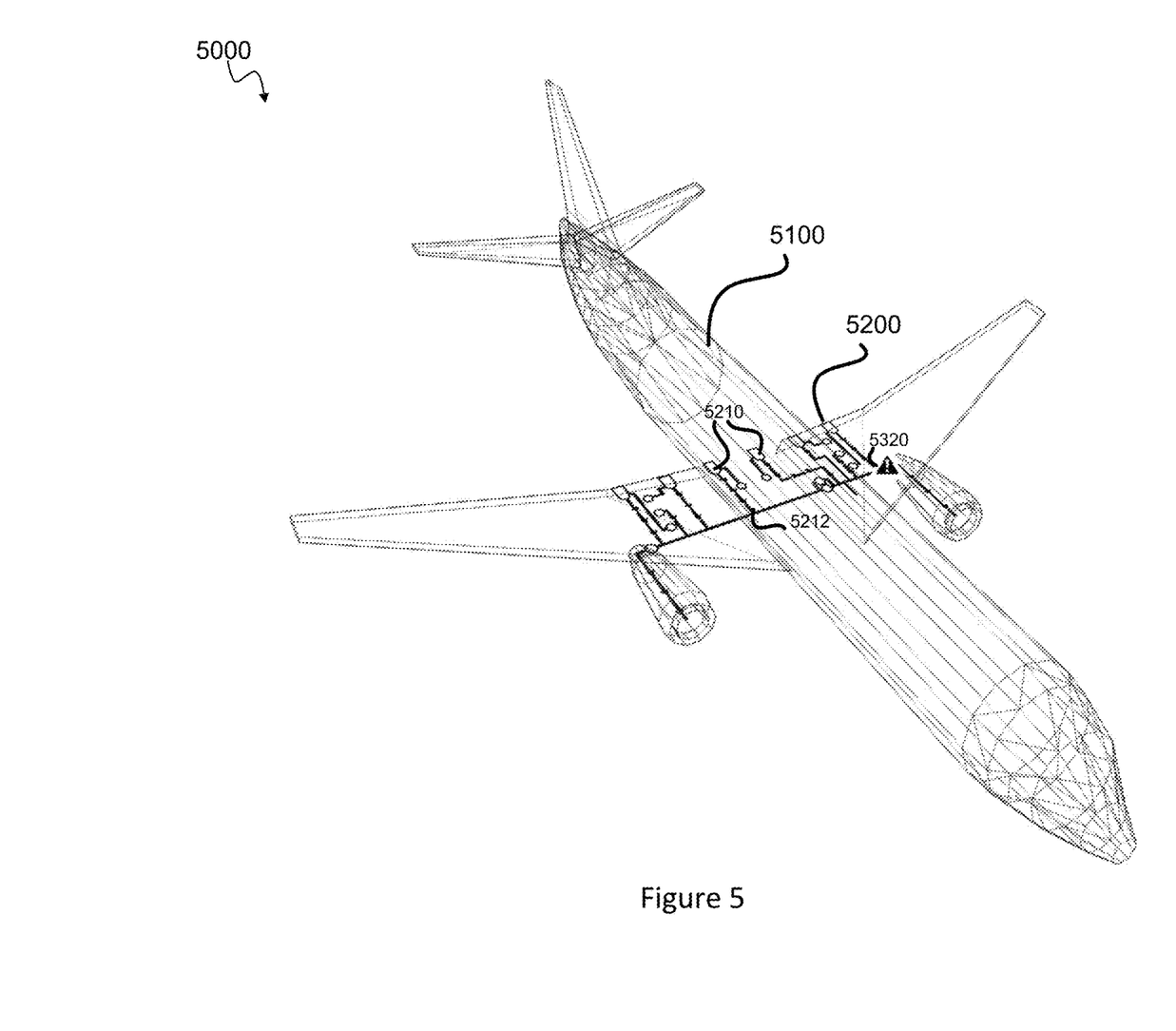
FIG. 5 is a logical view of a third exemplary GUI depiction in accordance with an embodiment of the present invention.

In some embodiments, clicking or otherwise selecting 2040 the dynamic virtual sub-system 3200 in the graphical user interface module 1150 may also provide a close-up depiction 4000 thereof. In other embodiments, the graphical user interface module 1150 may provide an interface to enter a fixed zoom-view value (e.g., 100%, 150%, 600%, etc.) and/or a dynamic pan view and/or a zoom view tool. The close-up depiction 5000 may also automatically triggered during the interactive computer simulation (e.g., 2034 in real-time) or after completion of the interactive computer simulation (e.g., 2032 during a replay in a postmortem session) in relation to, for instance, status of one or more virtual sub-systems, malfunction(s), related threshold level (e.g., empty tank), action(s) taken or expected from trainees, etc.

Figure 6:
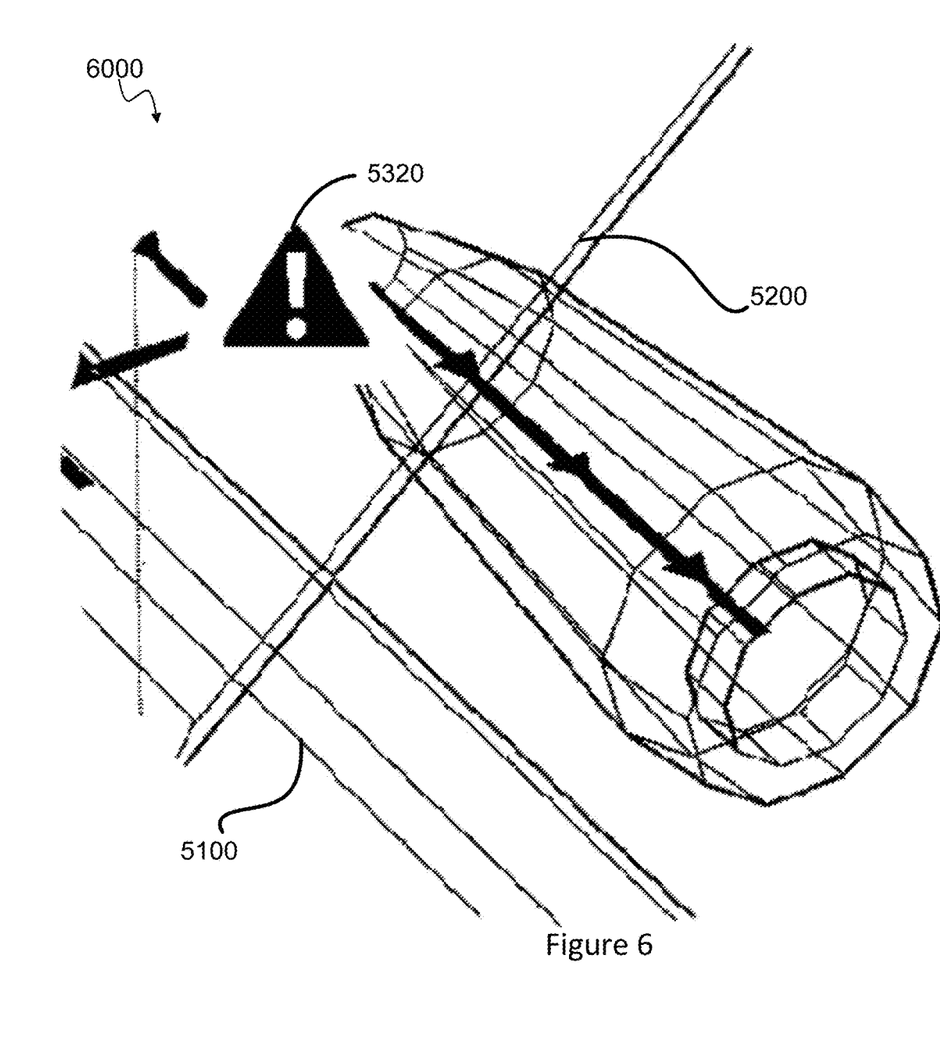
FIG. 6 is a logical view of a fourth exemplary GUI depiction in accordance with an embodiment of the present invention.

FIG. 5 shows a depiction 5000 comprising a logical rendering of an aircraft as the exemplary virtual simulated element 5100. The aircraft 5100 would be displayed in 2010. The depiction 5000 also shows a logical rendering of a fuel distribution system as the exemplary virtual dynamic sub-system 5200. The logical rendering of the fuel distribution system 5200 would be displayed upon selection 2020 (e.g., clicked on the aircraft 5100 or selected in a menu (not shown) or the like). The logical rendering of the fuel distribution system 5200 comprises logical views of fuel pumps 5210 and fuel distribution pipes 5212. Based on dynamic data previously lagged (2050) concerning the fuel distribution system 5200, a warning icon 5320 is provided in relation to the highlighted section 5310 of the logical fuel distribution pipes 5212. The warning icon 5320 represents one way of displaying (2060) the dynamic data related to the logical rendering of the fuel distribution system 5200. In some embodiments, numerical values (not shown) may alternatively or additionally be provided to represent the dynamic data (e.g., numerical value (s) added as a floating text box when a cursor is brought over the virtual dynamic sub-system 5200 and/or the warning icon(s) 5320). A close-up depiction 6000 may also be provided in relation to the depiction 5000. For instance, in the context of an interactive computer simulation related to a flight in which a virtual landing gear sub-system is selected in 2040, the landing gear assembly itself (e.g., wheels, suspension and arms) may be depicted through the GUI module 1150 using realistic rendering while logical rendering is used for showing oil pressure in hydraulic elements of the landing gear sub-system (e.g., color scheme on the pressure while the landing gear is retracting). In the context of an interactive computer simulation related to a flight in which a virtual fuel subsystem is selected in 2040 following interruption of flow therein (e.g., the flow is stopped), a logical view of the related electrical system may be rendered with a realistic view of a related pump.

In some embodiments, the depiction 4000 and 6000 may be provided by the graphical user interface module 1150 considering a perspective selection. The selected virtual sub-system may then be displayed 2060 together with the related dynamic data from the selected perspective selection. Examples of perspectives include a set of preset perspectives (e.g., each associated with one or more virtual sub-system selected in 2040, as depicted in 4000, 6000), which may be automatically selected or triggered when a trigger event occurs in the interactive computer simulation. One of the preset perspectives may also be explicitly selected from the graphical user interface module 1150. A floating perspective may also be selected in which at least one of a relative distance from the virtual simulated element and a relative position to the virtual simulated element is dynamically adjusted through the graphical user interface module 1150.

In some embodiments, selecting the virtual sub-system 2040 may be performed from the graphical user interface module 1150. Examples of user interface virtual sub-system selection include a menu selection from a menu portion of the graphical user interface and an interactive selection from the interactive display portion of the graphical user interface that displays the virtual simulated element. Selecting the virtual sub-system 2040 may also be triggered by detecting a trigger event in the interactive computer simulation. For instance, the simulation plan may provide different events for which one or more specific virtual sub-systems is of greater interest. Other examples of trigger events include specific interactions of the virtual simulated element in the interactive computer simulation (e.g., landing gear deployed outside of the target speed range may select the landing gear sub-system) specific interactions of the virtual simulated element with another virtual simulated element in the interactive computer simulation (e.g., between an aircraft as the virtual simulated element and a control tower as the second virtual simulated element where settings of the respective communication sub-system are critical).

When the interactive computer simulation comprises a second virtual simulated element comprising a second set of dynamic virtual sub-systems, dynamic data in relation to the second set of dynamic virtual sub-systems may also be logged in the storage system 1500. The graphical user interface 1500 may allow for selecting one or more of the virtual simulated element and the second virtual simulated element for display. In some embodiments, the processor module 1130 further processes corresponding dynamic data from the virtual simulated element and the second virtual simulated element for detecting trends therein (e.g., matching similar manipulation mistakes made on similar aircrafts in similar conditions to enhance training or matching similar behaviors of the aircraft under different manipulations to enhance the quality of the simulation models or to detect potential issues with the actual element). Likewise, it may be possible to process dynamic data from different interactive computer simulations on the same virtual simulated element (e.g., same scenario by the same trainee) for detecting trends.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities. The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A method for visualizing dynamic virtual sub-systems of at least one virtual simulated element in an interactive computer simulation system, the simulation system comprising a computer-generated environment, wherein the virtual simulated element is a simulated aircraft system, and wherein one or more tangible instruments are provided for enabling a user to control the virtual simulated element in the computer-generated environment, the method comprising the steps of:

providing for display a graphical user interface comprising an interactive display portion depicting a rendered view of the virtual simulated element;

while a user controls the virtual simulated element in the interactive computer simulation system using at least one of the one or more tangible instruments during an interactive computer simulation, logging in real-time dynamic data of the virtual simulated element generated in response to the user using the at least one of the one or more tangible instruments during the interactive computer simulation, the dynamic data defining an operational state of the dynamic virtual sub-systems and being logged in relation to the dynamic virtual sub-systems in a storage system of the interactive computer simulation system;

selecting for display a dynamic virtual sub-system of the virtual simulated element;

loading a subset of dynamic data related to the selected virtual sub-system from the storage system; and providing for display the selected virtual sub-system together with the related dynamic data on the graphical user interface.

2. The method of claim 1, wherein: the step of selecting a virtual sub-system is performed after the interactive computer simulation is completed; and the subset of dynamic data is related to a period of time covering simulated events from the interactive computer simulation, the simulated events being related to the selected virtual sub-system.

3. The method of claim 2, further comprising receiving the period of time from the graphical user interface.

4. The method of claim 1, wherein the step of selecting a virtual sub system takes place during the interactive computer simulation; and the steps of loading a subset of dynamic data related to the selected virtual sub-system and logging dynamic data in relation to the selected virtual sub-system are performed concurrently.

5. The method of claim 4, further comprising the step of triggering a malfunction event in relation to the selected virtual sub-system.

6. The method of claim 5, further comprising the step of loading a simulation plan for the interactive computer simulation from the storage system, wherein the malfunction event is triggered from the simulation plan for the interactive computer simulation.

7. The method of claim 5, further comprising the step of receiving the malfunction event in a malfunction selection from the graphical user interface before triggering the malfunction event.

8. The method of claim 1, further comprising the step of receiving a view-type selection from the graphical user interface before displaying the selected virtual sub-system together with the related dynamic data, the view-type selection being used for selecting from at least two of:
   a realistic view-type in which the virtual simulated element and the selected virtual sub-system are depicted using realistic rendering;
   a logical view-type in which the virtual simulated element and the selected virtual sub-system are depicted using logical rendering;
   a hybrid view-type in which one of the virtual simulated element or the selected virtual sub-system is depicted using logical rendering while the other one is depicted using realistic rendering; and
   a multi-hybrid view-type in which at least one of the virtual simulated element and the selected virtual sub-system is depicted using logical rendering and realistic rendering; wherein the step of displaying is performed according to the selected view-type.

9. The method of claim 1, further comprising the step of receiving a perspective selection from the graphical user interface for displaying the selected virtual sub-system together with the related dynamic data, the perspective selection being used for selecting from at least two of:
   one of a set of preset perspectives triggered when a trigger event occurs in the interactive computer simulation;
   one of the set of preset perspectives selected from the graphical user interface; and
   a floating perspective in which at least one of a relative distance from the virtual simulated element and a relative position to the virtual simulated element is dynamically adjusted through the graphical user interface.

10. The method of claim 1, wherein the step of selecting the virtual sub-system comprises, receiving from the graphical user interface a virtual sub-system selection of at least one of the dynamic virtual sub-systems, the virtual sub-system selection being received between:
   a menu selection from a menu portion of the graphical user interface; and
   an interactive selection from the interactive display portion of the graphical user interface that displays the virtual simulated element.

11. The method of claim 1, wherein the interactive computer simulation comprises a second virtual simulated element comprising a second set of dynamic virtual sub-systems, the method further comprising, the step of logging dynamic data in relation to the second set of dynamic virtual sub-systems in the storage system while the interactive computer simulation is performed in the interactive computer simulation system and further comprising the step of receiving a simulated element-selection for selecting one or more of the virtual simulated element and the second virtual simulated element for display.

12. The method of claim 11, further comprising the step of processing corresponding dynamic data in relation to the virtual simulated element and corresponding dynamic data in relation to the second virtual simulated element for detecting trends therein.

13. The method of claim 1, wherein the step of logging is performed for two simulations and further comprising the step of processing the logged data to detect trends therein.

14. An interactive computer simulation system comprising a computer-generated environment comprising a virtual simulated element, the interactive computer simulation system comprising:
   one or more tangible instruments for controlling the virtual simulated element in the computer-generated environment, wherein the virtual simulated element is a simulated aircraft system, and the virtual simulated element comprises a plurality of dynamic virtual sub-systems;
   a storage system for logging dynamic data of the virtual simulated element in real-time, the dynamic data being generated in response to the user using at least one of the one or more tangible instruments to control the virtual simulated element during an interactive computer simulation performed in the interactive computer simulation system, the dynamic data defining an operational state of the dynamic virtual sub-systems and being logged in relation to the dynamic virtual sub-systems;
   a processor module configured for selecting for display a dynamic virtual sub-system of the virtual simulated element and for loading a subset of dynamic data related to the selected virtual sub-system from the storage system; and
   a graphical user interface configured for displaying an interactive display portion depicting a rendered view of the virtual simulated element and for displaying the selected virtual sub-system together with the related dynamic data thereon.

15. The interactive computer simulation system of claim 14, wherein:
   the processor module is configured to load the subset of dynamic data related to the selected virtual sub-system while the storage system logs dynamic data in relation to the selected virtual sub-system if the interactive computer simulation is still being performed upon selection of the virtual sub-system.

16. The interactive computer simulation system of claim 14, wherein the processor module is configured to trigger a malfunction event in the interaction computer simulation in relation to the selected virtual sub-system when the interactive computer simulation is still being performed upon selection of the virtual sub-system.

17. The interactive computer simulation system of claim 16, wherein:
   the malfunction event is triggered from a simulation plan when the processor module further loads the simulation plan for the interactive computer simulation from the storage system.

18. The interactive computer simulation system of claim 16, wherein: the malfunction event is triggered by the processor module in response thereto, when the graphical user interface further receives a malfunction selection.

19. The interactive computer simulation system of claim 14, wherein: the interactive computer simulation comprises a second virtual simulated element comprising a second set of dynamic virtual sub-systems; and the storage system is further configured to log dynamic data in relation to the second set of dynamic virtual sub-systems while the interactive computer simulation is performed in the interactive computer simulation system.

20. The interactive computer simulation system of claim 19, wherein the processor module is further configured to process the logged dynamic data in order to detect trends therein.

21. The interactive computer simulation system of claim 14, wherein the storage system is configured to log a second set of dynamic data in relation to the dynamic virtual sub-systems while a second interactive computer simulation of the virtual simulated element is performed and wherein the processor module is further configured to process the logged dynamic data in order to detect trends therein.

22. A non-transitory memory having computer-readable instructions stored thereon which, when executed by a processing unit of an interactive computer simulation system, configure the processing unit to perform the steps of:
- providing for display a graphical user interface comprising an interactive display portion depicting a rendered view of at least one virtual simulated element in the interactive computer simulation system, wherein the virtual simulated element is a simulated aircraft system, the at least one virtual simulated element controlled by one or more tangible instruments;
- logging in real-time dynamic data in relation to dynamic virtual sub-systems of the at least one virtual simulated element in a storage system of the interactive computer simulation system in response to the user using at least one of the one or more tangible instruments while an interactive computer simulation of the virtual simulated element is performed in the interactive computer simulation system, the dynamic data defining an operational state of the dynamic virtual sub-systems;
- selecting for display a-dynamic virtual sub-system of the virtual simulated element;
- loading a subset of dynamic data related to the selected virtual sub-system from the storage system; and
- providing for display the selected virtual sub-system together with the related dynamic data on the graphical user interface.

\* \* \* \* \*